United States Patent [19]
Hager, III et al.

[11] Patent Number: 5,748,470
[45] Date of Patent: May 5, 1998

[54] SEMICONDUCTOR PROCESSING BACKUP SYSTEM

[75] Inventors: Arthur L. Hager, III, Auburn; Brian E. Marchant, Woodside; Shouping Chuang, Carmichael; Ki Duk Kim, Orangeville, all of Calif.

[73] Assignee: NEC Electronics, Inc., Santa Clara, Calif.

[21] Appl. No.: 596,785

[22] Filed: Feb. 5, 1996

Related U.S. Application Data

[63] Continuation of Ser. No. 236,609, May 2, 1994, abandoned.
[51] Int. Cl.$^6$ .................................................. G05B 9/02
[52] U.S. Cl. ........................... 364/187; 395/182.02
[58] Field of Search .................... 364/184, 187; 395/182.02, 182.08, 182.11, 182.13, 182.18

[56] References Cited

U.S. PATENT DOCUMENTS

| | | | |
|---|---|---|---|
| 4,228,496 | 10/1980 | Katzmann et al. | 395/308 |
| 4,453,215 | 6/1984 | Reid | 395/182.09 |
| 4,644,538 | 2/1987 | Cooper et al. | 364/184 X |
| 4,773,072 | 9/1988 | Fennel | 364/187 |
| 4,819,156 | 4/1989 | DeLorme et al. | 395/182.13 |
| 4,823,256 | 4/1989 | Bishop et al. | 364/187 |
| 4,849,979 | 7/1989 | Maccianti et al. | 395/183.17 |
| 4,881,166 | 11/1989 | Thompson et al. | 707/8 |
| 5,008,805 | 4/1991 | Fiebig et al. | 364/187 X |
| 5,072,368 | 12/1991 | Foreman et al. | 395/182.04 |
| 5,086,499 | 2/1992 | Mutone | 371/8.1 X |
| 5,088,021 | 2/1992 | McLaughlin et al. | 364/187 |
| 5,140,689 | 8/1992 | Kobayashi | 395/182.18 |
| 5,146,589 | 9/1992 | Peet, Jr. et al. | 395/182.01 |
| 5,247,664 | 9/1993 | Thompson et al. | 707/10 |
| 5,271,023 | 12/1993 | Norman | 395/182.08 |
| 5,329,521 | 7/1994 | Walsh et al. | 395/182.02 |
| 5,343,477 | 8/1994 | Yamada | 395/182.02 |
| 5,448,724 | 9/1995 | Hayashi | 395/182.02 |

OTHER PUBLICATIONS

Quick Start Semiconsuctor Automation Program Description, Consilium, ITP Systems (date unknown).
Semiconductor Automation and the Role of Workstream DFS/A, Consilium publication, Sep., 1993.
A Fault Tolerant Implemenation Using Multiple–Task Triple Modular Redundancy, Christopher P. Fuhrman, Sailesh Chutani and Henri J. Nussbaumer, Factory Communications Systems, IEEE, 1995.
Reliable Scheduling in a TMR Database System, Frank M. Pittelli and Hector Garcia–Molina, ACM Transactions on Computer Systems, vol. 7, No. 1, Feb. 1989, pp. 25–38.
SYBASE Replication Server, May 1993, pp. 1–8.
Replication Server: A Component of SYBASE System 10, Apr. 1993, pp. 1–26.
Consilium, Workstream DFS/A Brochure, Feb. 1993.

*Primary Examiner*—Reba I. Elmore
*Assistant Examiner*—Sheela S. Rao
*Attorney, Agent, or Firm*—Skjerven, Morrill, MacPherson, Franklin & Friel, L.L.P.; Stephen A. Terrile

[57] ABSTRACT

A manufacturing system is disclosed which includes first and second control devices as well as a communication terminal which controls communication with the control devices. The communications terminal includes an interceptor module which receives information from the manufacturing device and provides this information to the first and second control devices.

6 Claims, 6 Drawing Sheets

SEMICONDUCTOR PROCESSING BACKUP SYSTEM

This application is a continuation of application Ser. No. 08/236,609, filed May 2, 1994 now abandoned.

FIELD OF THE INVENTION

The present invention relates to manufacturing systems and more particularly to semiconductor processing manufacturing systems.

BACKGROUND OF THE INVENTION

It is known to control manufacturing systems such as semiconductor processing manufacturing systems with computers. Because of the magnitude of information that is necessary to control these systems as well as the distance between devices which are controlled, these systems are generally controlled by mainframe computers.

For example, referring to FIG. 1 (Prior Art), one such semiconductor processing system 10 uses mainframe 11 which is coupled to a plurality of gates 12, e.g., system network architecture (SNA) gateways available from Novell™ Corporation of Provo, Utah under the trade designation 3270. Gates 12 are coupled to respective routers 13 to provide separate segments of system 10. The segments are coupled via backbone bus 15.

A plurality of gates 12 are coupled to a respective plurality of communication terminals (CT) 14 which are in turn coupled to the actual semiconductor processing manufacturing devices (MD) 16. The communication terminals 14 and manufacturing devices 16 located between each gate 12 and router 13 provide separate processing portions 18.

Additionally, a gate 12 is coupled to stocker portion 20 of semiconductor processing system 10. Stocker portion 20 includes stocker server 22, as well as a plurality of stocker personal computers (PCs) 24. Stocker PC's 24 are coupled to stockers 26 which provide storage bays for the semiconductor lot boxes and transportation between the storage bays.

Another gate 12 is coupled to analysis portion 30 of semiconductor processing system 10. Analysis portion 30 includes equipment status server 34 which stores and reports on the equipment status and history and trend and engineering analysis (TEA) server 36 which collects and reports on process measurement data.

Another gate 12 is coupled to work station portion 40. Work station portion 40 includes a plurality of work stations 42 which are used to provide visual information to users regarding the condition of manufacturing system 10.

SUMMARY OF THE INVENTION

It has been discovered that by providing a manufacturing system with first and second control devices as well as a communication terminal which controls communication with the control devices, the manufacturing system advantageously includes fault tolerant functionality. More specifically, the invention relates to a semiconductor processing system which includes a first control device, a second control device, a processing portion and a stocker portion. The processing portion includes a communications terminal which is coupled to the first device and includes an interceptor portion, a manufacturing device which is coupled to the communications terminal and an interceptor controller which is coupled to the interceptor portion. The second control device is coupled to the communications terminal. The stocker portion is coupled to the first and second control devices and includes a stocker terminal, a stocking device and a stocker controller. The stocker terminal includes a stocker terminal interceptor portion. The stocking device is coupled to the stocker terminal. The stocker interceptor controller is coupled to the stocker terminal interceptor portion. The interceptor portion and the interceptor controller together provide a processing portion interceptor module which receives a first response from one of the first and second control devices, stores the response until a second response is received from the other of the first and second control devices, and compares the first and second responses to independently determine whether a potential fault exists with one of the first and second control devices. The stocker terminal interceptor portion and the stocker interceptor controller together providing a stocker interceptor modulewhich receives a first response from one of the first and second control devices, stores the response until a second response is received from the other of the first and second control devices, and compares the first and second responses to independently determine whether a potential fault exists with one of the first and second control devices. The combination of the processing portion interceptor module, the stocker interceptor module, and the first and second control devices provides a backup system which provides continuous operation of the manufacturing system in the event that there is a fault with one of the first and second control devices.

DETAILED DESCRIPTION

Figure 1:
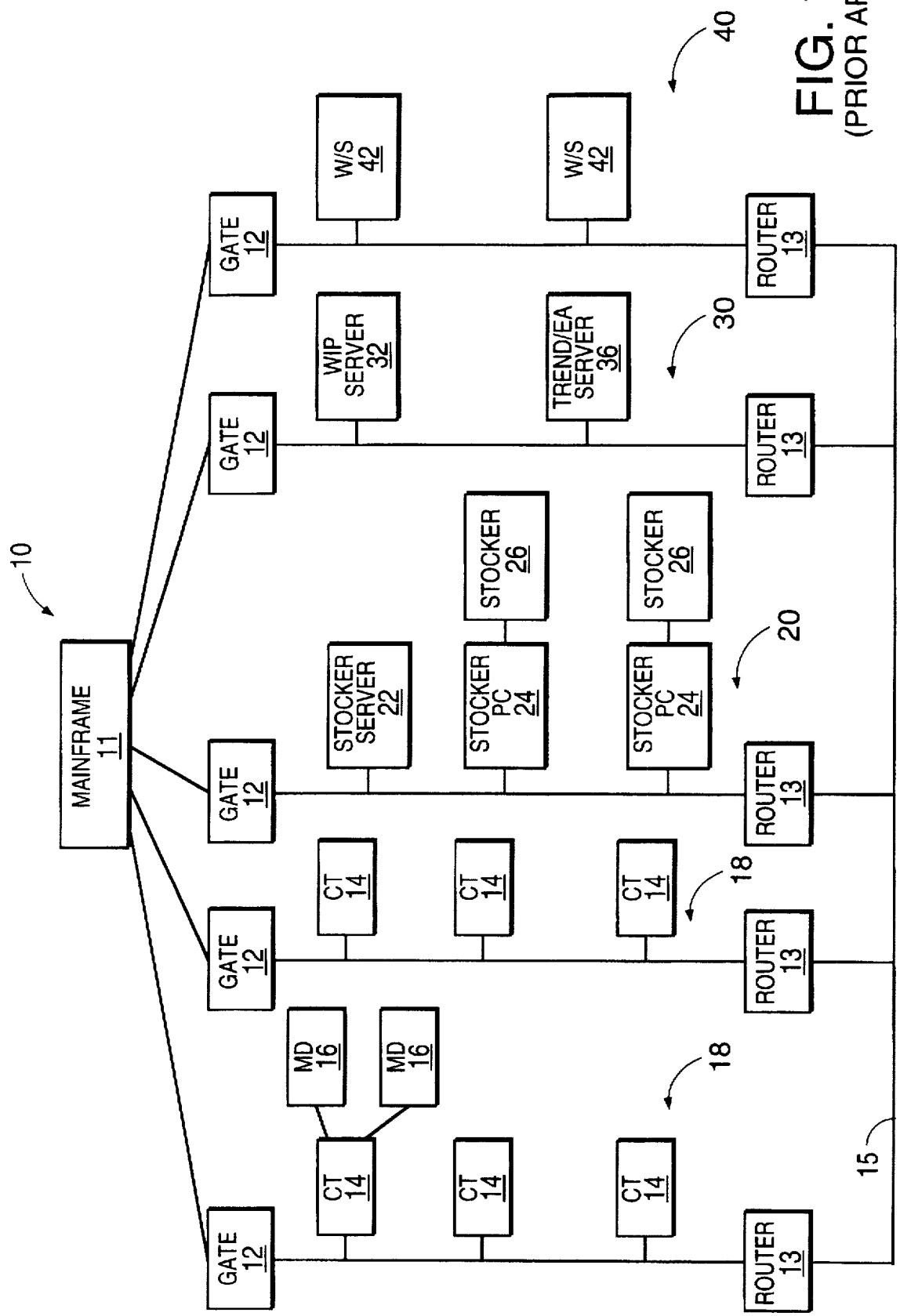
FIG. 1 is a block diagram of a prior art manufacturing system.
Figure 2:
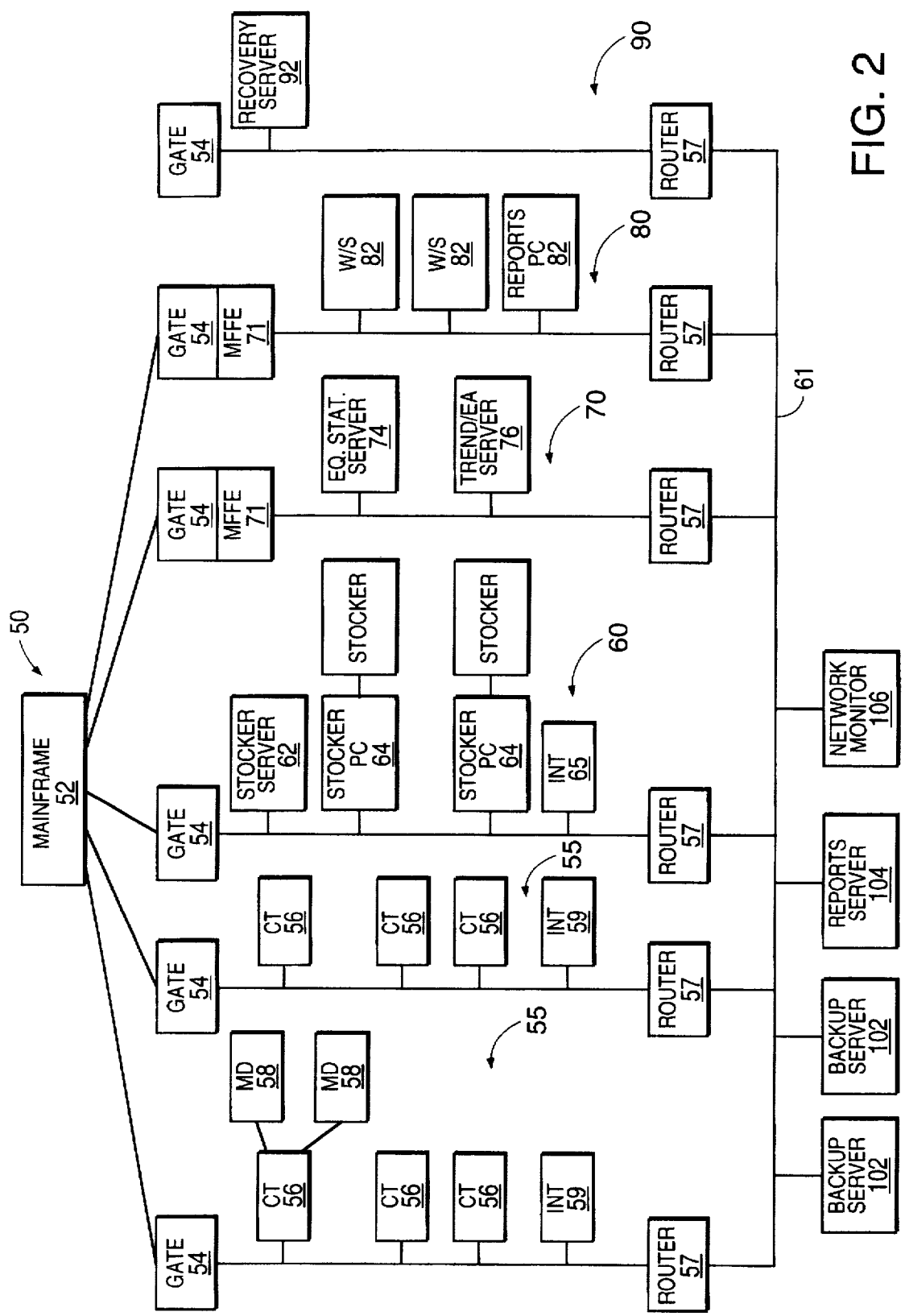
FIG. 2 is a block diagram of a manufacturing system in accordance with the present invention.

Referring to FIG. 2, manufacturing system 50, which in the preferred embodiment is a semiconductor processing system, includes mainframe 52 which functions as a first control device and is coupled to a plurality of gates 54, e.g., system network architecture (SNA) gateways available from Novell™ Corporation of Provo, Utah under the trade designation 3270. Gates 54 are coupled to respective routers 57, which are available from SynOptics™ of Santa Clara, Calif. under the trade designation 2813, to provide separate segments of system 50. The segments are coupled via backbone bus 61. Gates 54 and routers 57 function as segmenters which divide information traffic into different segments with backbone bus 61 linking the different segments together.

One or more gates 54 are coupled to respective processing portions 55. Each processing portion 55 includes a plurality of communication terminals 56 which are in turn coupled to the actual semiconductor processing manufacturing devices 58. Communications terminals 56 each include an interceptor portion. Additionally, each processing portion 55 also includes a respective interceptor controller 59. The combination of the communication terminal interceptor portion and interceptor controller 59 provide an interceptor module.

Additionally, a gate 54 is coupled to stocker portion 60 of semiconductor processing system 50. Stocker portion 60 includes stocker server 62, a plurality of stocker PCs 64 as well as stocker interceptor controller 65. Each stocker PC 64 is coupled to a stocker having a stocker bay and a stocker transport system. Additionally, each stocker PC 64 includes a stocker interceptor portion coupled between the stocker PC and gate 54 and router 57. The combination of each stocker interceptor portion and the interceptor controller 65 provide respective interceptor modules.

An Analysis gate 54 is coupled to analysis portion 70 of semiconductor processing system 50. The analysis gate 54 is coupled to analysis portion 70 via a first mainframe frontend 71. Analysis portion 70 includes equipment status server 74 which stores and reports on the equipment status and history and trend and engineering analysis (Trend/EA) server 76 which collects and reports on process measurement data.

A work station gate 54 is coupled to work station (W/S) portion 80 of semiconductor processing system 50. The work station gate is coupled to W/S portion 80 via a second mainframe front end 71. W/S portion 80 includes a plurality of individual work stations 82 as well as reports PC 86.

Another gate is coupled to recovery portion 90. Recovery portion 90 includes recovery server 92 which is discussed in more detail below.

Processing portion 55, stocker portion 60, analysis portion 70, W/S portion 80 and recovery portion 90 are each coupled between respective gates 54 and routers 57. Gates 54 and routers 98 function as segmenters which divide information traffic into different segments with backbone bus 61 linking the different segments together. Backbone bus 61 is also coupled to backup servers 102, each of which function as a second control device, reports server 104 and network monitor 106.

Figure 3:
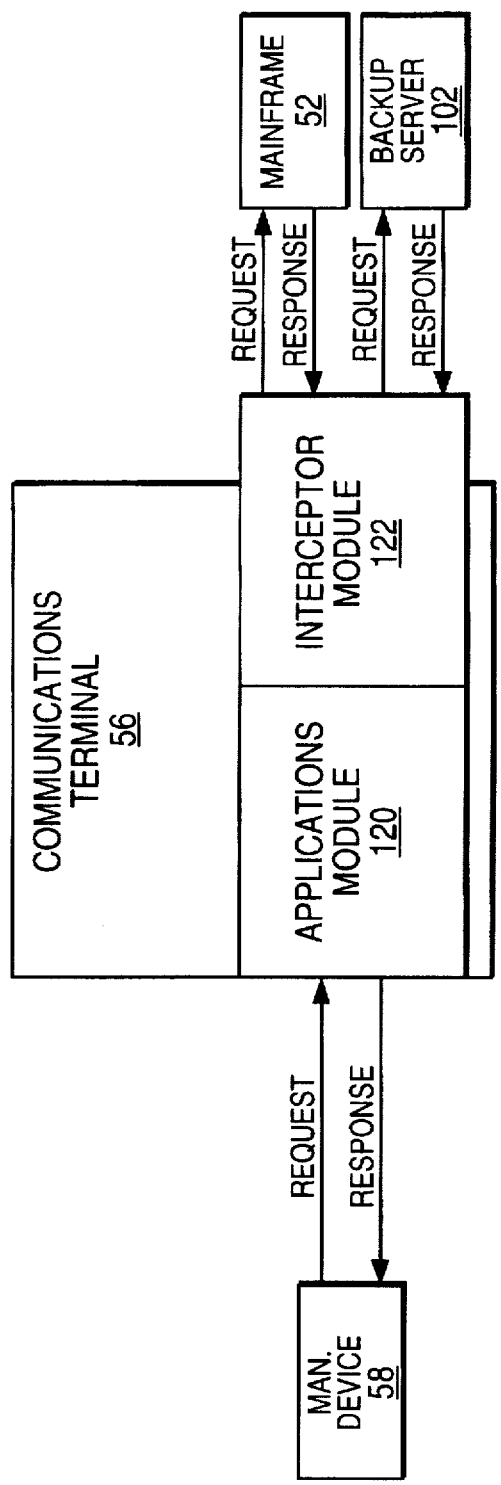
FIG. 3 is a block diagram of an interceptor module residing in a communications terminal of the FIG. 2 manufacturing system.

Referring to FIG. 3, communications terminal 56 includes a plurality of software modules. More specifically, communications terminal 56 includes applications software module 120 and interceptor software module 122. Applications software module 120 interacts and controls the manufacturing devices 58 which are coupled with communications terminal 56. Interceptor software module 122 controls the interaction between communications terminal 56 and mainframe 52 and backup servers 102.

During operation, interceptor module 122 receives a request from a manufacturing device 58. This message is sent to both mainframe 52 and backup servers 102. Mainframe 52 and backup servers 102 provide respective responses to communication interceptor module 122. Interceptor module 122 holds the first received response in a response queue until all responses are received. Interceptor module 122 then sends the response to manufacturing device 58. If mainframe 52 and backup servers 102 provide different responses indicating a potential fault, then interceptor module 122 determines which response to send to manufacturing device 58 and these responses are logged in network monitor 106 (see FIG. 2) for investigation.

Figure 4:
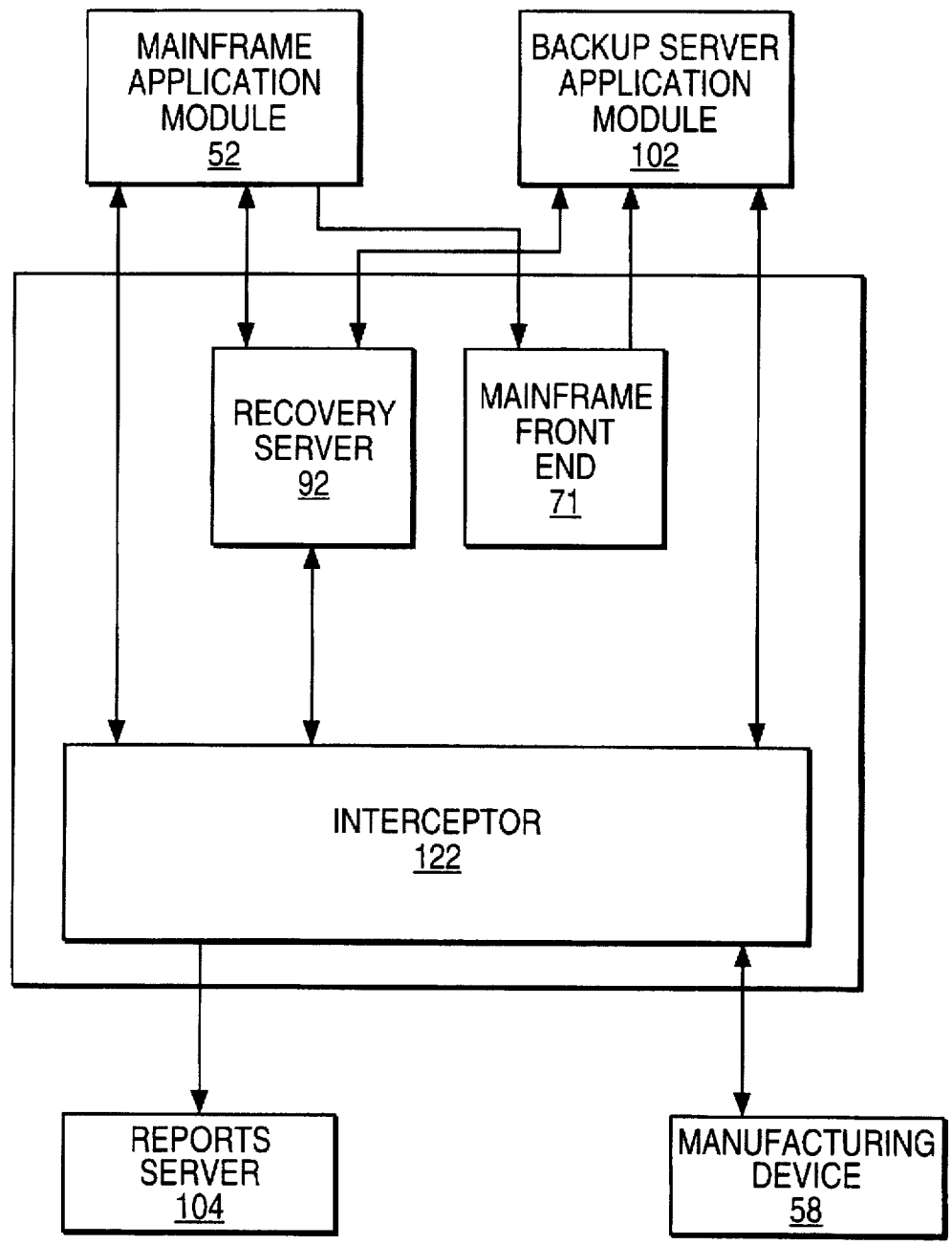
FIG. 4 is block diagram of the interaction of the elements of the backup system of the FIG. 2 manufacturing system.

Referring to FIG. 4, the combination of the interceptor module 122 and the first and second control devices provides backup system 130 (not illustrated) which allows for a fault tolerant manufacturing system. Backup system 130 provides an environment for applications to continue to operate whether or not mainframe 52 or backup servers 102 are functioning. Additionally, the backup system 130 includes hardware and software redundancies such as recovery server 92 and mainframe frontend 71 which prevent a single component failure from stopping the operation of backup system 130. Backup system 130 includes a plurality of features which are discussed below.

The backup system allows applications to run on backup servers 102 in parallel with mainframe 52. Interceptor module 122 receives requests from a manufacturing device 58, duplicates the requests, sends the requests to applications servers and compares the responses from the application servers. In the preferred embodiment, mainframe 52 and backup servers 102 are the applications servers, however, additional applications servers, such as additional backup servers, may also be provided as part of backup system 130.

Backup system 130 also stores files from backup servers 102 simultaneously with storing backup files from mainframe 52. Backup servers 102 require notification of any changes that are made to mainframe 52, as these changes could affect backup operation. Accordingly, when changes are made to the mainframe software, the file changes are downloaded to backup servers 102 and the files of backup servers 102 are updated.

Backup system 130 also saves input messages in time order while one of the application servers is inoperable and retransmits the input messages after the inoperable application server returns to operation. Recovery server 92 is provided for this function. Additional recovery servers may also be provided. If more than one recovery server is provided, then objects which require time order sequencing stay on the recovery server 92, while objects which do not require time order sequencing may go to a different recovery server.

Both mainframe 52 and backup servers 102 have associated data bases which store backup application files and system environment files. Initially, the backup application files are downloaded from mainframe 52 to backup servers 102. The system environment files are manually entered through a file maintenance program.

The backup application files include a plurality of control files. More specifically, the backup application control files include a backup application file definition which is based on an application specification, an interceptor group definition which defines external interceptors which are shared by groups of manufacturing devices, a mainframe front end group definition which defines groups of devices which are assigned to particular mainframe front ends, a server group definition which provides information about to which application PC to send a request and to which history server to provide the primary application server response, a download type definition which defines download data types and associated application servers, a server characteristic which defines the characteristics of the servers, a recovery key position definition which defines recovery key position in transaction messages, a response comparison definition which defines position and length of fields for message comparison, a flow control configuration definition which defines timeout, retry and window size when two nodes are communicating with each other, a system parameter definition which defines the system environment, a mainframe backup file equivalence definition which defines file groups and equivalent files of each group for file comparison and a file comparison definition which defines fields for file comparison.

Backup system 130 also maintains backup applications and system files. More specifically, backup system 130 displays records for specified files and allows support personnel to change file values to control operation of the backup system. Backup system 130 also detects data discrepancy before the data is referenced by an application, thus anticipating potential errors.

Backup system 130 also includes a network monitor feature. The network monitor feature further includes a monitor recording feature and a monitor output feature. The monitor recording feature receives log messages from any network node and records the messages to a log file. The monitor output feature displays and prints log messages selectively.

Figure 5:
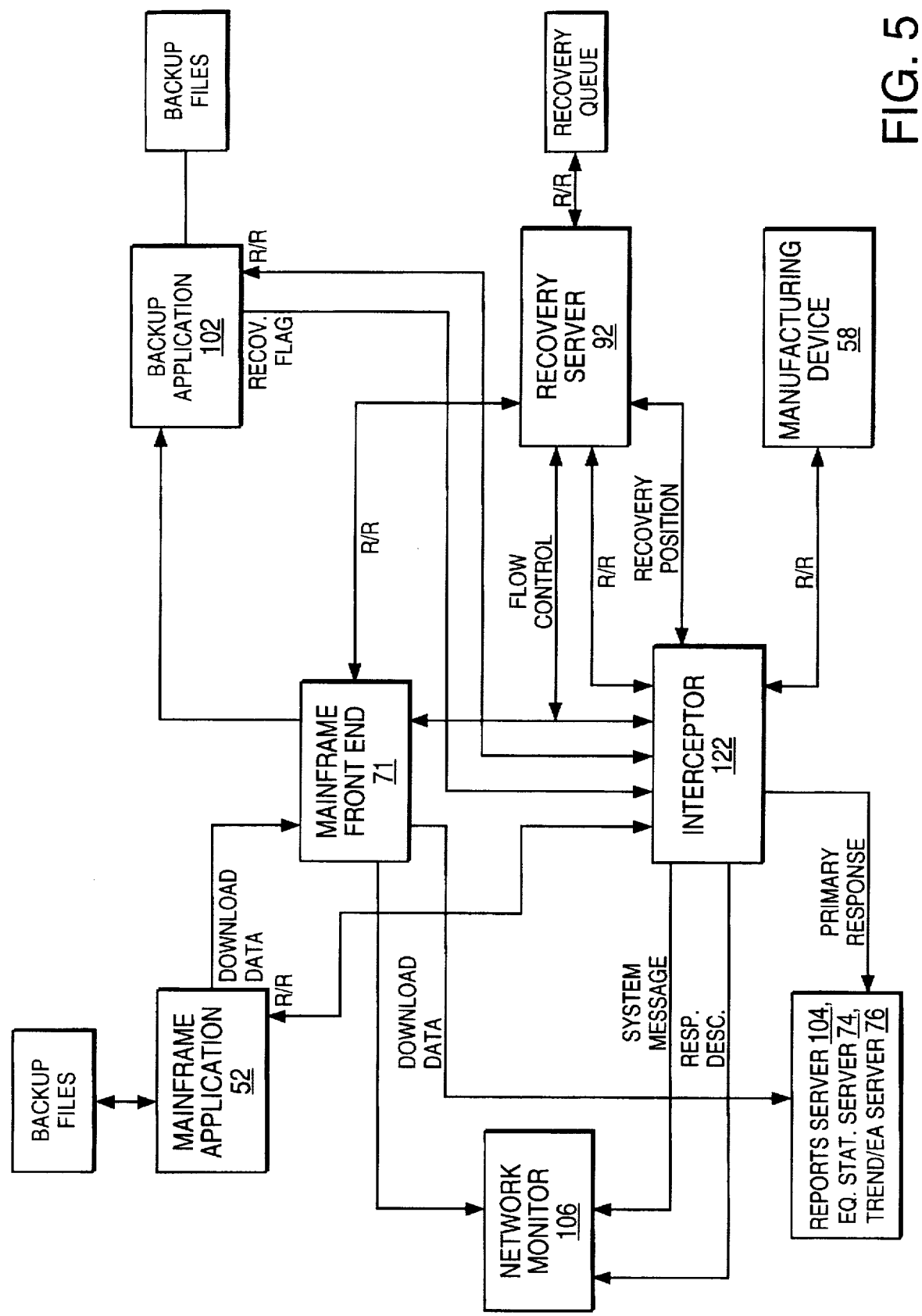
FIGS. 5 and 6 are block diagrams of the data flow of the backup system of the FIG. 2 manufacturing system.
Figure 6:
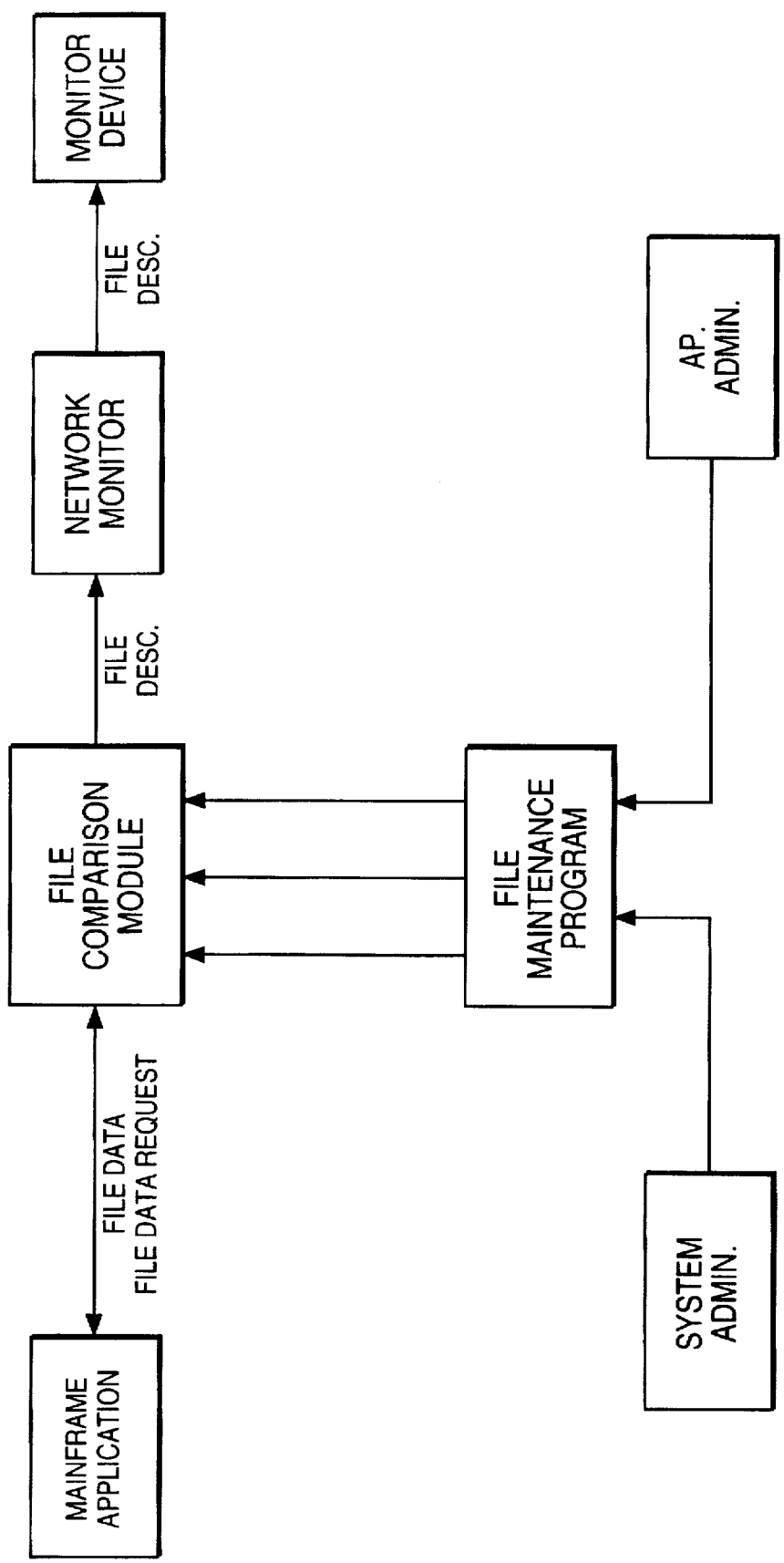

FIGS. 5 and 6 show the data flow between and among the modules of backup system 130 during operation. In operation, backup system 130 includes the interceptor module, the mainframe front end module, the recovery server module, the network monitor module, the file maintenance module and the file comparison module.

The interceptor module initiates an operation when interceptor 122 receives a request from a manufacturing device 58. Interceptor 122 extracts the transaction name from the request and uses the name to read the recovery flag key position in the message. Interceptor 122 uses the transaction name in conjunction with the equipment group code to get application and history server names from the server group definition. interceptor 122 also gets the designated recovery server from the server characteristic definition.

Interceptor 122 checks a server status flag which is stored in memory for each of the application servers. Using the server status flag prevents interceptor 122 from sending a message to a down server. Next, interceptor 122 extracts the recovery flag key from the message and sends a recovery flag request to all backup application servers which the server status flags show are active.

Interceptor 122 saves the request to a request queue. If there is not enough memory space for the request, the interceptor removes the oldest request from the queue to make room for the new request. Interceptor 122 then waits for the recovery flag from all active backup application servers. If interceptor 122 does not receive recovery flags from all servers before timeout, interceptor 122 sets the server status flag for the server that did not provide a recovery flag to show which servers are inactive. If more than one recovery flag is received, interceptor 122 uses the most current updated flag to continue the process. The request receives a recovery mode reply message if the recovery flag shows the request is in recovery mode for a specific application server.

Interceptor 122 then sends the request to active application servers (e.g., mainframe 52 and backup servers 102). Interceptor 122 also retrieves the timeout period from the server characteristic definition and sets a timeout time for each server.

Mainframe 52 and backup servers 102 process the request and send responses to interceptor 122. If the function which the message is requesting is not supported by backup servers 102, then backup servers 102 send an unsupported error message to interceptor 122 to indicate that the message is unsupported.

If the timeout period expires before a server response is received, interceptor 122 sets the server status flag to show that the server is down. If any server is down, messages are sent to recovery server 92 to be sent to the down server when it comes back up.

During normal processing, i.e., no server is down, interceptor 122 sends the response from the primary server to the manufacturing device 58 that generated the request. Interceptor 122 also sends the response from the primary server to reports server 104. Interceptor 122 receives the responses from both application servers and then interceptor 122 looks up the response comparison definition and compares the responses from mainframe 52 and backup servers 102 for fields defined in the response comparison definition. If the message is not supported by backup servers 102, then no field is defined in the response comparison definition and interceptor 122 ignores responses from backup servers 102. If any comparison discrepancy is detected, interceptor sends a response discrepancy message to network monitor 106. Whether or not a discrepancy is detected, interceptor 122 then deletes the request and responses related to the request from the message queue.

When any one of the application servers is down, interceptor 122 uses the transaction name and reads the recovery key position definition to get the back date field position of the request. Interceptor 122 then stores the date and time when the request was received to the back date field. The date and time information is used later by application servers for back date purposes. Interceptor 122 then reformats the request to include the down server name plus the request and sends the reformatted request to the recovery server 92 which corresponds to every down server. Interceptor 122 then sends the primary response to the manufacturing device. If the response from the primary server is an unrecognized or error message, the interceptor sends the response to network monitor 106 to log the message.

When the down application server comes back up, recovery server 92 begins sending the stored messages to the formerly down application server for processing. Thus, bringing the formerly down application server up to date with queued messages. Interceptor 122 receives a server response rerouted from recovery server 92. After the messages are all sent to the recovered application server, interceptor 122 then resets the server status flag to show that the server is up. Interceptor 122 compares the response with other previously received responses and sends a message to network monitor 106 if a response discrepancy is found. If the previously received responses are no longer in the memory due to limited memory space, the interceptor sends the response to network monitor 106.

During this recovery mode, interceptor 122 may receive a request from another manufacturing device 58. If so, interceptor 122 processes the request as normal if the request does not involve the recovery, i.e., the recovery flag shows that the objects referred to by the message are not in recovery mode. If the request involves the recovery, interceptor 122 processes the request as if one of the application servers is down. In this way, if the request requires a previous request to be processed, the new request is not processed by the recovering server until the previous request is processed, i.e., interceptor 122 and recovery server 92 maintain the time ordering of the requests.

The mainframe front end module is initiated by mainframe 52 reading download data type and server characteristic definitions during system startup and saving these definitions to the memory of mainframe 52. The mainframe front end process includes both a download portion and an upload portion.

During the download process, the mainframe front end sends a poll message to mainframe 52 when the front end first starts and sends the poll message again if it fails to receive any message before the polling interval expires. Mainframe front end 71 receives download data from mainframe 52 and saves the download data in memory. Mainframe front end 71 then determines the download message type from the transaction name and message type. Mainframe front end 71 uses the transaction name and message type to find the network application server names from the download data type definition. Mainframe front end 71 then determines whether the server status flag shows whether each backup server 102 is active. Mainframe front end 71 then sends the download data to the active backup servers 71. Mainframe front end 102 also determines a timeout period from the server characteristic definition for each server and sets a timeout timer for each server.

If the server status flag shows any server is down, then mainframe front end 71 reformats the download data to include the down server name plus the download data and sends the reformatted data to recovery server 92 which is dedicated to the down server. Mainframe front end 71 saves the download data in memory if recovery server 92 is down and retransmits the data when a recovery server up message is received.

Mainframe front end 71 receives acknowledgement messages from the active backup servers 102. If a timeout period expires before a server response is received, then mainframe front end 71 sets the server status flag to show that the server is down. Mainframe front end 71 deletes the download data after acknowledgements are received from the functioning backup servers 102 and the download data is sent to recovery server 92 for each nonfunctioning backup server.

Mainframe front end 71 sends a backup data message to mainframe 52 when the first acknowledging response from the functioning backup server is received. Mainframe front end 71 may receive the same download data again if mainframe 52 detects a timeout condition and the mainframe front end did not acknowledge the previous download data. Mainframe front end 71 replaces the download data in the memory and processes the download data as mainframe front end 71 receives a new download data. Mainframe front end 71 updates the server status flag when a server up message is received from each backup server 102 after messages involving the backup server are processed. In the event that all of the backup servers 102 are nonfunctioning and recovery server 92 is nonfunctioning, mainframe front end 71 sends an all down message to mainframe 52.

For an upload process, mainframe front end 71 receives an upload message from a recovery server 92. Mainframe front end 71 sends the upload message to mainframe 52 when a mainframe session is available. If a mainframe session is not available, mainframe front end 71 saves the message in a waiting to be transmitted queue for transmission when a session is available. After mainframe front end 71 receives a response from mainframe 52, mainframe front end 71 sends the response to the node from which the upload message was sent and the upload from the node to mainframe 52 commences.

When recovery server 92 is activated, it broadcasts its status to all interceptors 122 and mainframe front end 71 which are defined in the interceptor and mainframe front end group definitions. Upon receiving an active recovery server status signal, interceptors 122 send any pending messages, which are stored in the request queue, to recovery server 92 and mainframe front end 71 sends any pending messages to recovery server 92. Recovery server 92 receives the messages from interceptors 122 and uses the message identifies to rebuild the recovery queue. After recovery server 92 is activated, it receives messages from interceptor 122 and mainframe front end 71 when the recovery process is involved.

If a received message is the first message involving a nonfunctioning server, recovery server 92 reads the server characteristic definition to learn the server attributes and stores the definition in memory. Recovery server 92 saves the received message to the recovery queue. Recovery server 92 extracts the transaction name from the message and uses it to locate the entity key position which is defined in the recovery key position definition. Recovery server 92 then sends the entity key with a recovery flag which indicates the server down status to related backup application servers 102.

Recovery server 92 detects when the previously nonfunctioning server is functioning by polling the server. When recovery server 92 determines that a server is again functioning, recovery server 92 sends recovery flags to related backup application servers for all entities which are within the recovery queue. Each recovery flag then shows that the respective entity is in recovery mode. Recovery server 92 then reads the request or download data from the recovery queue and sends the data to the application server. If mainframe 52 is the destination, recovery server 92 reads the mainframe front end definition and sends the request through the mainframe front end 71 which is defined in the same application group. If the first mainframe front end is down, as detected by a timeout condition, recovery server 92 tries to send the request through an available mainframe front end 71.

When recovery server 92 receives the response or download data acknowledgement from the application server, recovery server 92 sends an entity recovery finished message to related backup application servers after the response to the last message of an entity in the recovery queue is received.

Recovery server 92 reroutes the response from the application server to interceptor 122 from which the request came. No download data acknowledgement is rerouted to the mainframe front end 71. Recovery server 92 then deletes the request and response from the recovery queue or deletes the download data after the server acknowledge is received.

The network monitor module initiates when network monitor 106 receives a response discrepancy message from interceptor 122, a file discrepancy message from the file comparison module or a system message from a node on the network. Network monitor 106 writes the received messages to the message log. Network monitor 106 uses monitor control parameters to set up the operation environment of network monitor 106. Network monitor 106 displays or prints the message log to an output device according to the monitor control parameters.

The file maintenance module initiates when the file maintenance module receives operation instructions. The file maintenance module prepares the screen format according to a predefined file structure. Each file structure defines a field name, length, type and default value of a file. The file maintenance module updates data from the application administrator, validates the data and updates the backup files or system definition files.

The file comparison module initiates by reading the file equivalence definition and displaying file group names on a display device. The file comparison module assigns the first file group to be compared as the base file. The file comparison module reads the file comparison definition for the base file and depending on the access type defined in the file comparison definition, the file comparison module either directly accesses the file or sends a request to mainframe 52 and waits for a file data response. The file comparison module then obtains the first record from the base file.

The file comparison module learns the key position and length from the file comparison definition, extracts the record key and saves the key. The file comparison module uses the key to obtain the equivalence record from the other servers defined in the file group. The file comparison module receives file data from all requested application servers and compares the fields of the records according the file comparison definition. If a discrepancy is found, the file comparison module sends a discrepancy message to network monitor 106 and displays the message on a display device.

The file comparison module then updates the screen data, obtains the next record from the base file and obtains the next key position. If the end of the base file is reached, the file comparison module determines the next file group to be compared and assigns the first file in the file group as the base file. If the end of a file group definition is reached, the file comparison module repeats the first file group and the file next to the last compared file is assigned to be the base file.

Other Embodiments

Other embodiments are within the following claims.

For example, while the preferred embodiment is described with a single backup server, additional backup servers may be included in the manufacturing system.

Also, for example, while the preferred embodiment is described with a mainframe as the first control device, a backup server may be designated as the primary control device and used as the first control device, thus replacing the mainframe.

What is claimed is:

1. A semiconductor processing system comprising
   a first control device,
   a processing portion, the processing portion including
      a communications terminal, the communications terminal being coupled to the first control device, the communications terminal including an interceptor portion,
      a manufacturing device, the manufacturing device being coupled to the communications terminal,
      an interceptor controller, the interceptor controller being coupled to the interceptor portion;
   a second control device, the second control device being coupled to the communications terminal; and
   a stocker portion, the stocker portion being coupled to the first and second control devices, the stocker portion including
      a stocker terminal, the stocker terminal including a stocker terminal interceptor portion,
      a stocking device, the stocking device being coupled to the stocker terminal, and
      a stocker interceptor controller, the stocker interceptor controller being coupled to the stocker terminal interceptor portion;
   the interceptor portion and the interceptor controller together providing a processing portion interceptor module, the processing portion interceptor module receiving a first response from one of the first and second control devices, storing the response until a second response is received from the other of the first and second control devices, and comparing the first and second responses to independently determine whether a potential fault exists with one of the first and second control devices, the stocker terminal interceptor portion and the stocker interceptor controller together providing a stocker interceptor module, the stocker interceptor module receiving a first response from one of the first and second control devices, storing the response until a second response is received from the other of the first and second control devices, and comparing the first and second responses to independently determine whether a potential fault exists with one of the first and second control devices, the combination of the processing portion interceptor module, the stocker interceptor module, and the first and second control devices providing a backup system, the backup system providing continuous operation of the manufacturing system in the event that there is a fault with one of the first and second control devices.

2. The manufacturing system of claim 1 wherein the processing portion interceptor module and the stocker interceptor module send valid responses to the manufacturing device and the stocking device, respectively, if one of the first response and the second response are valid.

3. The manufacturing system of claim 1 further comprising a network monitor, and wherein
   the processing portion interceptor module sends a message to the network monitor if the processing portion interceptor module determines that there is a potential fault in one of the first and second control devices.

4. The manufacturing system of claim 1 further comprising a network monitor, and wherein
   the stocker interceptor module sends a message to the network monitor if the stocker interceptor module determines that there is a potential fault in one of the first and second control devices.

5. The manufacturing system of claim 1 wherein
   the communications terminal further includes an application module, the application module being coupled between the manufacturing device and the interceptor module and interacting and controlling the manufacturing device.

6. The manufacturing system of claim 1 wherein
   the stocker terminal further includes a stocker application module, the stocker application module being coupled between the stocking device and the stocker interceptor module and interacting and controlling the stocking device.

* * * * *